United States Patent [19]

Takahashi et al.

[11] Patent Number: 5,100,833

[45] Date of Patent: Mar. 31, 1992

[54] METHOD OF PRODUCING A SEMICONDUCTOR LIGHT EMITTING DEVICE DISPOSED IN AN INSULATING SUBSTRATE

[75] Inventors: Shogo Takahashi; Etsuji Omura, both of Itami, Japan

[73] Assignee: Mitsubishi Denki Kabushiki Kaisha, Japan

[21] Appl. No.: 607,044

[22] Filed: Oct. 31, 1990

Related U.S. Application Data

[62] Division of Ser. No. 227,124, Aug. 2, 1988, Pat. No. 5,003,358.

[30] Foreign Application Priority Data

Aug. 5, 1987 [JP] Japan .................. 62-196821

[51] Int. Cl.$^5$ ............................................. H01L 21/20
[52] U.S. Cl. ..................................... 437/129; 437/90; 437/126; 437/127; 437/133; 437/925; 437/906; 148/DIG. 72; 148/DIG. 99
[58] Field of Search ............... 437/129, 90, 126, 133, 437/905, 906, 127; 148/DIG. 25, DIG. 50, DIG. 72, DIG. 99; 372/48

[56] References Cited

U.S. PATENT DOCUMENTS

| | | | |
|---|---|---|---|
| 4,575,852 | 3/1986 | Fujimoto et al. | 357/17 |
| 4,608,695 | 8/1986 | Oda et al. | 357/17 |
| 4,644,552 | 2/1987 | Ohshima et al. | 357/17 |
| 4,663,831 | 5/1987 | Birrittella et al. | 437/89 |
| 4,675,710 | 6/1987 | Ishikawa et al. | 372/48 |
| 4,692,206 | 9/1987 | Kaneiwa et al. | 357/17 |
| 4,723,251 | 2/1988 | Sakakibara et al. | 357/17 |
| 4,725,112 | 2/1988 | Bridges et al. | 359/96.12 |
| 4,740,976 | 4/1988 | Kajimura et al. | 357/17 |
| 4,764,246 | 8/1988 | Bridges et al. | 437/126 |
| 4,766,093 | 8/1988 | Hovel et al. | 437/129 |
| 4,779,283 | 10/1988 | Ohnaka et al. | 357/17 |
| 4,788,159 | 11/1988 | Smith | 437/127 |
| 4,801,993 | 1/1989 | Andri et al. | 357/17 |
| 4,847,845 | 7/1989 | Omura et al. | 372/46 |
| 4,849,371 | 7/1989 | Mansen et al. | 437/89 |
| 4,966,863 | 10/1990 | Mizuochi et al. | 372/48 |

FOREIGN PATENT DOCUMENTS

| | | |
|---|---|---|
| 30775 | 3/1981 | Japan . |
| 71987 | 6/1981 | Japan . |
| 135994 | 10/1981 | Japan . |
| 30385 | 2/1982 | Japan . |
| 162483 | 10/1982 | Japan . |
| 12389 | 1/1983 | Japan . |
| 204587 | 11/1983 | Japan . |
| 108382 | 6/1984 | Japan . |
| 202676 | 11/1984 | Japan . |
| 49484 | 3/1986 | Japan .................. 437/90 |
| 166266 | 7/1988 | Japan .................. 437/126 |

OTHER PUBLICATIONS

Kakimoto et al., "1.55 μm InGaAsP . . . Laser Diode", First Opto-electronics Conference Technical Digest, 1986, pp. 202-203 (1986).

*Primary Examiner*—Brian E. Hearn
*Assistant Examiner*—Linda J. Fleck
*Attorney, Agent, or Firm*—Leydig, Voit & Mayer

[57] ABSTRACT

A semiconductor light emitting device includes a vertical aperture produced at a main surface of a semi-insulating or insulating substrate, a transverse aperture provided in the substrate communicating with the vertical aperture, a conducting semiconductor layer buried in the vertical aperture and the transverse aperture, a groove produced by etching the substrate from the surface thereof until reaching the conducting semiconductor layer at a portion of the transverse aperture, and a light emitting element produced in the groove, and the light emitting region of the element being buried in the groove and connected with the buried conducting semiconductor layer. Accordingly, no pn junction exists at the periphery of the light emitting region, and a semiconductor light emitting element of quite low parasitic capacitance is obtained at high yield. A planar structure in which two electrodes are produced at the same plane is obtained, resulting in ease of integration and enhancement of the integration density.

3 Claims, 6 Drawing Sheets

METHOD OF PRODUCING A SEMICONDUCTOR LIGHT EMITTING DEVICE DISPOSED IN AN INSULATING SUBSTRATE

This application is a division of application Ser. No. 227,124, filed Aug. 2, 1988, now U.S. Pat. No. 5,003,358.

FIELD OF THE INVENTION

The present invention relates to a semiconductor light emitting device and production method thereof, and more particularly to an enhancement in operation speed and integration density.

BACKGROUND OF THE INVENTION

FIG. 5 shows a prior art buried type semiconductor laser as a semiconductor light emitting device.

As illustrated in FIG. 5, a prior art buried type semiconductor laser starts with an n-type InP substrate 1. A p-type InP blocking layer 2, an n-type InP blocking layer 3, and an InGaAsP active layer 70 are successively grown on the n-type InP substrate 1 by such as liquid phase epitaxy. A V-shaped groove 60 is produced through three layers 70, 3, and 2 so as to reach into the substrate 1 such as by etching. An n-type InP cladding layer 51 is buried in the V-shaped groove 60 and an InGaAsP active layer 71 is produced on the n-type InP cladding layer 51. A p-type InP cladding layer 80 is grown on the InGaAsP active layer 71 in the groove 60 and on the InGaAsP active layer 70 outside the groove 60 and the surface thereof is made flat. A p-type InGaAsP contact layer 90 is produced on the p-type InP cladding layer 80. A p side electrode 100 is provided on the p-type InGaAsP contact layer 90 and an n side electrode 110 is provided on the n-type InP substrate 1. The device operates as follows.

When a voltage is applied between the p side electrode 100 and the n side electrode, a current flows only through the V-shaped groove 60 which is between the p-type InP blocking layer 2 and the n-type InP blocking layer 3. The current stimulates emission of laser light at the InGaAsP active layer 71 buried in the V-shaped groove 60.

In this prior art buried type layer of such a construction, the position control of the InGaAsP active layer 71 in the V-shaped groove 60 is difficult because of the shape of the groove. Further, due to pn junctions existing at the periphery of the V-shaped groove the parasitic capacitance is large resulting in leakage current and limitation of response speed. In addition, since the p side electrode 100 and the n side electrode 110 are produced at opposing surfaces of the n-type InP substrate 1, the device is difficult to integrate with other electronic elements.

SUMMARY OF THE INVENTION

An object of the present invention is to provide a semiconductor light emitting device with reduced criticality in controlling the position of the active layer and preventing leakage current.

Another object of the present invention is to provide a semiconductor light emitting device having reduced parasitic capacitance and improved high speed response.

Still another object of the present invention is to provide such a device with a planar structure to enhance its integration density.

Yet another object of the present invention is to provide a method for producing such a device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor light emitting device comprising a vertical aperture produced at the main surface of a semi-insulating or insulating substrate, a transverse aperture communicated with the vertical aperture, a conducting semiconductor layer buried in the vertical aperture and the transverse aperture, a groove produced by etching the semi-insulating or insulating substrate from the surface thereof to one end portion of the transverse aperture, a light emitting element produced in the groove, including a light emitting region buried in the groove. Thus, the light emitting region is buried in the substrate, thereby making the current confinement complete. Further, since there is no pn junction at the periphery of the light emitting element, parasitic capacitances are gone. Furthermore, since one of two electrodes is taken to the surface of the substrate through the semiconductor layer buried in the transverse aperture, a planar structure is obtained.

DETAILED DESCRIPTION OF THE PREFERRED EMBODIMENTS

Figure 1A:
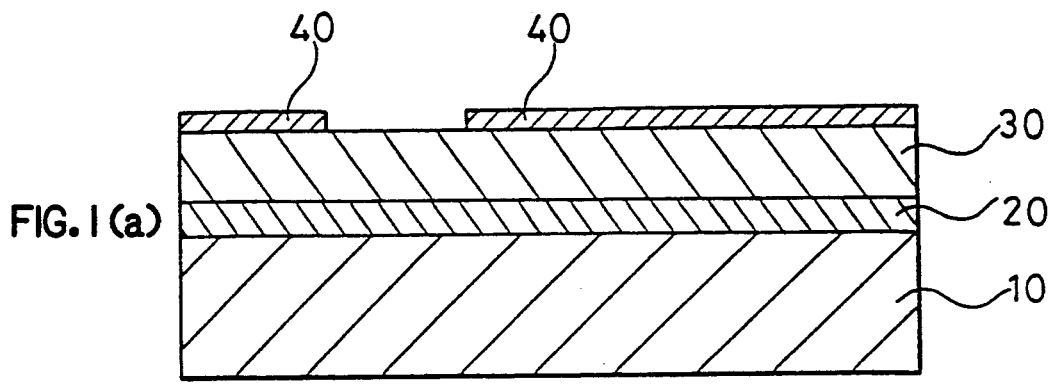
FIG. 1 is a diagram showing a production process of a semiconductor light emitting device according to an embodiment of the present invention.

An embodiment of the present invention will be described in detail with reference to the drawings.

FIG. 1 shows a production process of a semiconductor light emitting device according to a process embodiment of the present invention. In FIG. 1, reference numeral 10 designates a substrate such as a semi-insulating InP substrate. An InGaAsP layer 20 is produced on the InP substrate 10. A semi-insulating InP growth layer 30 is produced on the InGaAsP layer 20. Photoresist 40 is plated on the InP growth layer 30. An n-type InP layer 50 is buried in the vertical aperture 60A and the transverse aperture 60B communicating therewith. An n-type InP cladding layer 51, an InGaAsP active layer 70, and a p-type InP cladding layer 80 are buried in a groove 60C produced by etching until reaching the InGaAsP layer 20 at the other end of the transverse aperture 60B. A p-type InGaAsP contact layer 90 is produced on the p-type InP cladding layer 80 also in the groove 60C. A p side electrode 100 is provided on the contact layer 90 and an n side electrode 110 is provided on the n-type InP layer 50. The n-type or p-type InP layers 50, 51, 80 have impurity concentration of about 1 ×10$^{18}$/cm$^3$ and the p-type InGaAsP contact layer 90 has impurity concentration of about 1 ×10$^{19}$/cm$^3$.

The production process will be described.

First of all, as shown in FIG. 1(a), an InGaAsP layer 20 and a semi-insulating InP growth layer 30 are produced successively on a semi-insulating InP substrate 10 by a vapor phase epitaxy. Thereafter, photoresist 40 is patterned by photolithography.

Figure 1B:
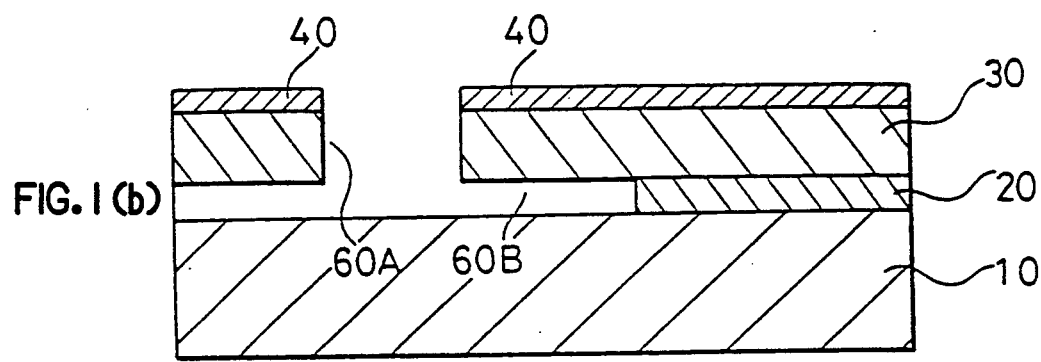

Next, as shown in FIG. 1(b), the semi-insulating InP growth layer 30 is etched by an etchant such as hydrochloric acid up until reaching the InGaAsP layer 20 thereby to produce a vertical aperture 60A, and thereafter, the InGaAsP layer 20 is selectively etched by an etchant such as mixture solution of sulfuric acid, hydrogen peroxide, and water, thereby producing a transverse aperture 60B.

Figure 1C:
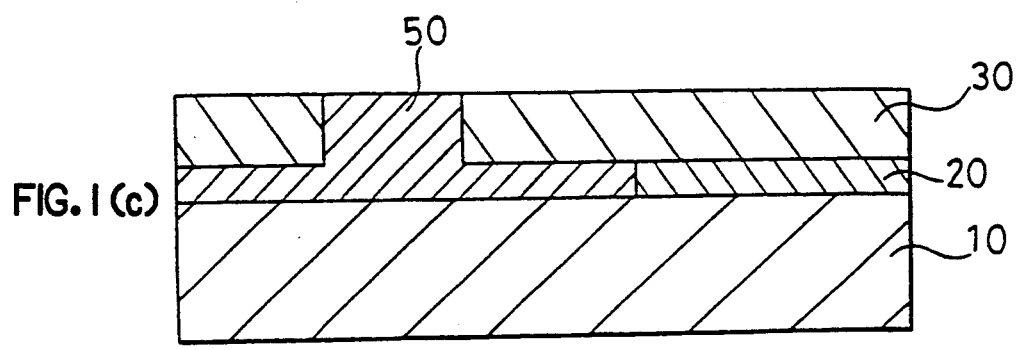

Next, as shown in FIG. 1(c), a region 50 of the n-type InP is deposited in vertical aperture 60A and transverse aperture 60B.

Figure 1D:
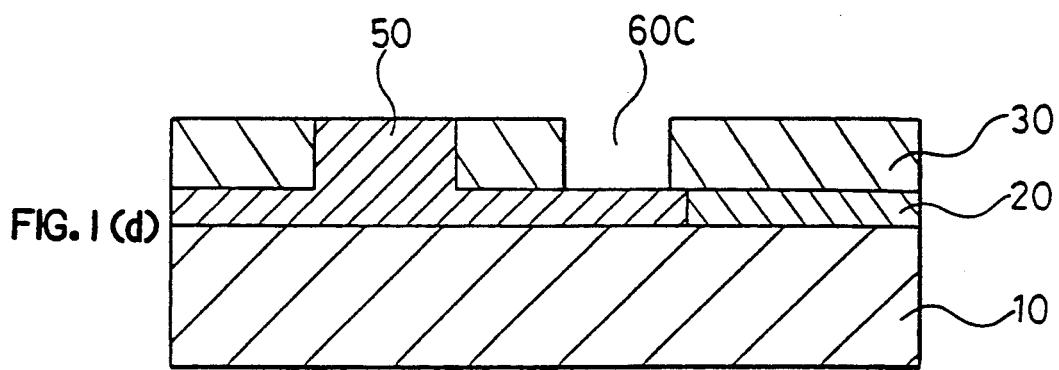

Next, as shown in FIG. 1(d), a region of the semi-insulating InP growth layer 30 positioned above end of the n-type InP layer 50 is etched until the n-type InP layer 50 is reached to produce a groove 60C.

Figure 1E:
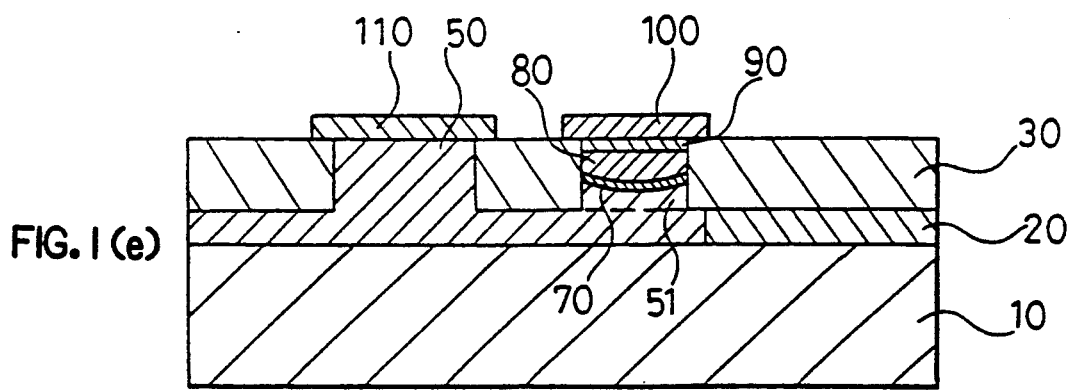

Thereafter, as shown in FIG. 1(e), an n-type InP cladding layer 51, an InGaAsP active layer 70, a p-type InP cladding layer 80, and a p-type InGaAsP contact layer 90 are successively grown on the n-type InP layer 50 in the groove 60C, and a buried type laser is produced buried in the semi-insulating InP growth layer 30. Thereafter, a p side electrode 100 and an n side electrode 110 are produced on the n-type InP layer 50 and the p-type InGaAsP contact layer 90, respectively, at the same plane.

The operation of the semiconductor light emitting device produced as such will be described.

In FIG. 1(e), a current flowing from the p side electrode 100 and the n type electrode 110 is converted into a light output by the InGaAsP active layer 70 buried in the semi-insulating InP growth layer 30. Then, since the semi-insulating InP growth layer 30 is provided at the periphery of the InGaAsP active layer 70 so as to surround the same, current does not leak at the periphery of the active layer 70. Furthermore, since the n-type InP cladding layer 51 is connected with the conducting n-type InP layer 50 buried in the transverse aperture 60B, it is possible to take the n side electrode 110 up to the surface of a wafer, thereby obtaining a planar structure.

Figure 2:
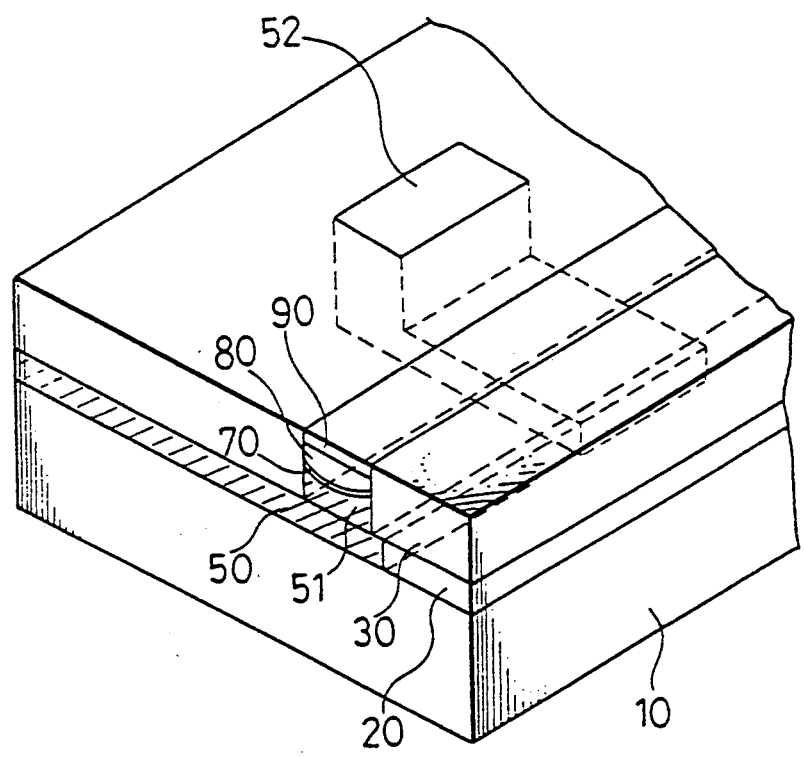
FIG. 2 is a perspective view showing a semiconductor light emitting device according to an embodiment of the present invention.

While the n-type InP layer 50 in the vertical aperture is produced in a stripe configuration in FIG. 1, the n-type InP layer may be produced only at a part of the region lying outside the light emitting region. FIG. 2 shows a device embodiment of the present invention having an n-type InP layer 52 of such a construction. Also in this embodiment, the same effects as in the first embodiment are obtained.

FIG. 3 shows a production process according to another process embodiment of the present invention.

In this second process embodiment, a vertical aperture 11 is produced by etching a semi-insulating InP substrate 10. A SiO$_2$ mask 12 is produced by sputtering and photolithography (FIG. 3(a)).

Figure 3A:
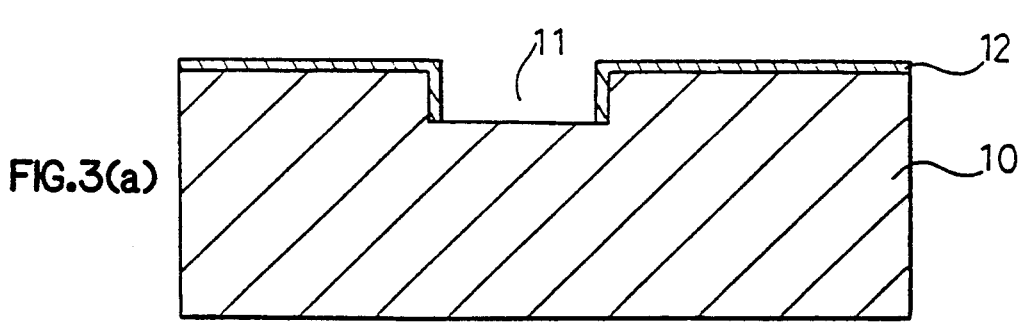
FIG. 3 is a diagram showing a production process of a semiconductor light emitting device according to another embodiment of the present invention.
Figure 3B:
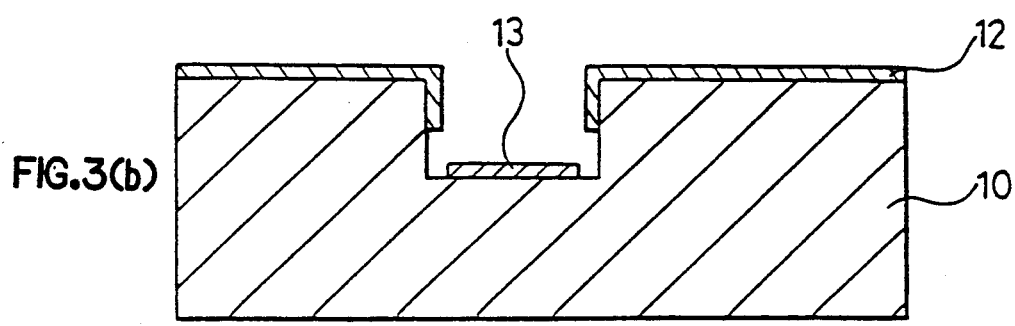
Figure 3C:
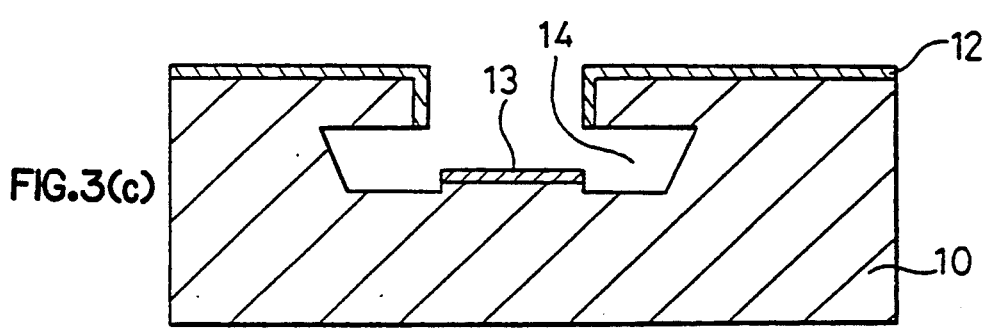

Next, as shown in FIG. 3(b), the vertical aperture 11 is further etched into substrate 10, and a SiO$_2$ mask 13 is produced at a bottom portion of the aperture 11 by evaporation. Further etching is employed to produce a transverse aperture 14 as shown in FIG. 3(c).

Figure 3D:
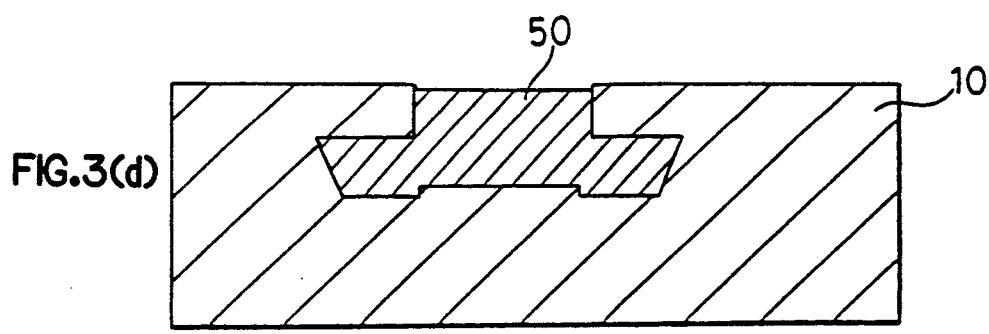
Figure 3E:
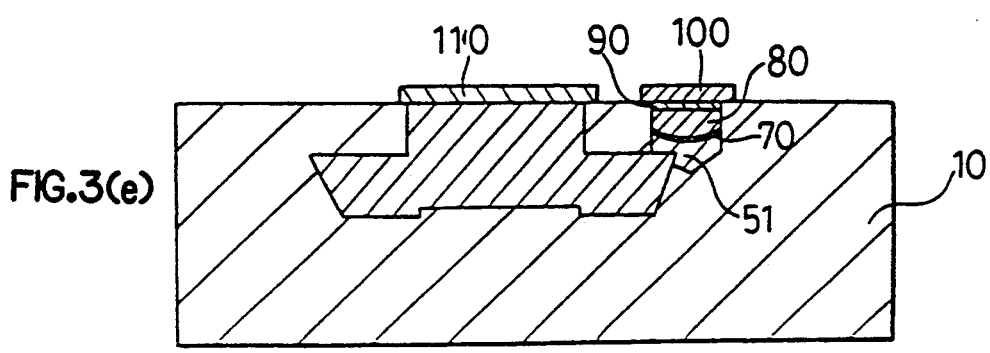

Next, as shown in FIG. 3(d), an n-type InP layer 50 is grown buried in the vertical aperture 11 and the transverse aperture 14, and thereafter, a groove is produced by etching and a buried type laser is produced in the groove as shown in FIG. 3(e) by the same process as that employed in the process of FIG. 1.

This process embodiment has an advantage in that only two crystalline growth steps are required, contrary to that three times crystal growths are required in the first process embodiment.

Figure 4A:
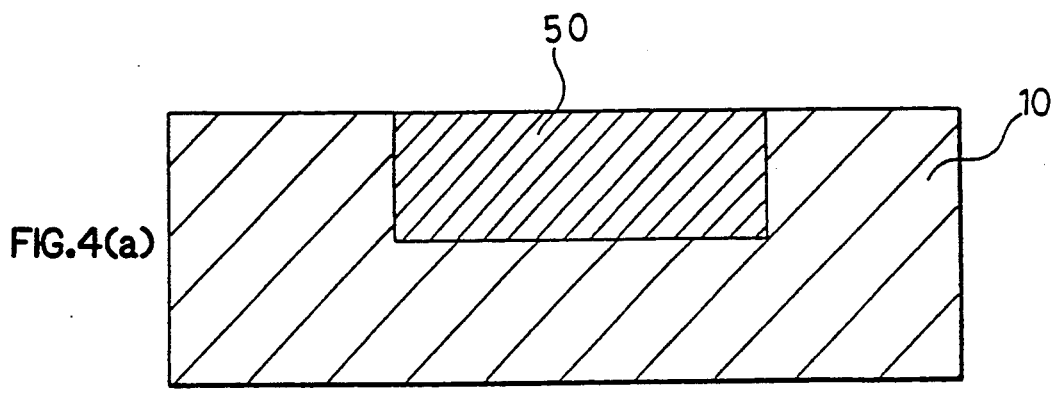
FIG. 4 is a cross sectional view showing a production process of a semiconductor light emitting device according to still another embodiment of the present invention and FIG. 5 is a cross sectional view showing a prior art semiconductor light emitting device.
Figure 4B:
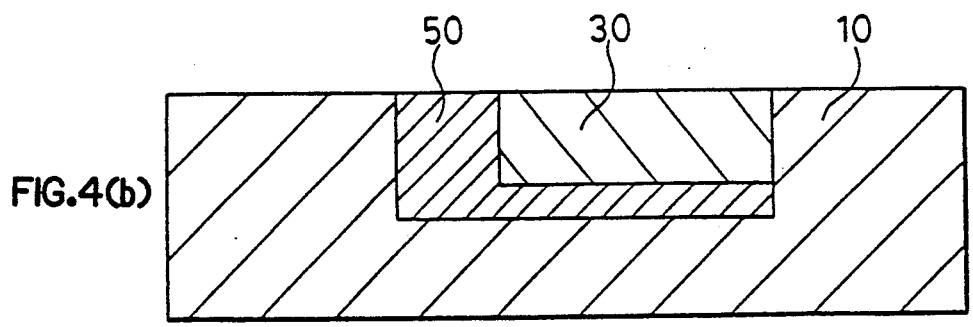
Figure 4C:
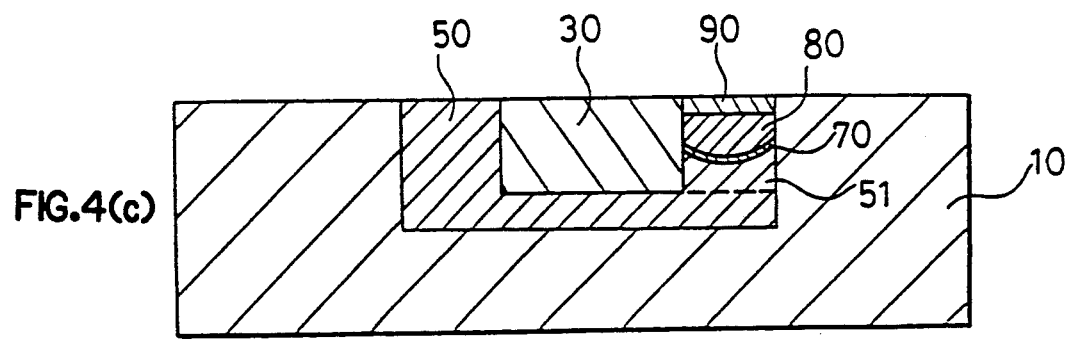
Figure 5:
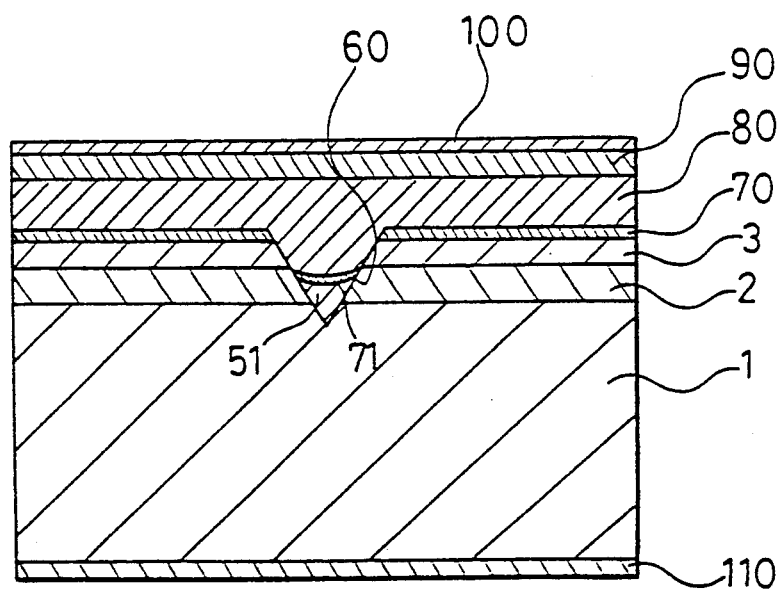

FIG. 4 shows a production process according to still another process embodiment of the present invention.

First of all, an n-type InP layer 50 is buried at a desired depth in the semi-insulating InP substrate 10. Thereafter a semi-insulating InP growth layer 30 is buried in a portion of the n-type InP layer 50 in a depth shallower than the n-type InP layer 50. A partially completed device in which the n-type InP layer 50 is produced in a vertical aperture and a transverse aperture similar to the embodiments of FIGS. 1 and 3 is thus produced. Thereafter, a buried type laser is produced buried in a groove produced at an end portion of the semi-insulating InP growth layer 30 at the side opposite to the n-type InP layer 50, according to the present invention.

While in the above-illustrated embodiment InP series compound semiconductor is employed, other compound semiconductors such as GaAs may be used.

As is evident from the foregoing description, according to the present invention, a vertical aperture is produced at a main surface of a semi-insulating or insulating substrate, a transverse aperture is produced communicating with this vertical aperture, a conducting semiconductor layer is buried in the vertical aperture and the transverse aperture, a groove reaching the semiconductor layer from the surface of the substrate is produced above an end portion of the transverse aperture, and a light emitting element is produced, buried in the groove in such a manner that the light emitting region thereof is buried in the groove and is connected to the buried semiconductor layer. Since the light emitting region is buried in the substrate no pn junction exists at the periphery of the light emitting region, thereby eliminating current leakage, and a semiconductor light emitting device of quite low parasitic capacitance is obtained at high yield. Furthermore, the p and n side electrodes can be provided on a main surface of the substrate so that a planar structure is obtained. This property results in simplicity in integration with other electronic elements and enhancement in integration density.

What is claimed is:

1. A process of producing a semiconductor light emitting device comprising the steps of:
   etching a semi-insulating or insulating substrate to produce a groove;
   growing a conducting semiconductor layer in said groove;
   growing a semi-insulating or insulating layer over a portion of said conducting semiconductor layer;
   etching said semi-insulating semiconductor layer to reach said conducting semiconductor layer;
   successively growing semiconductor layers functioning as a light emitting element and including a light emitting region in said groove; and depositing electrodes on the surface of said conducting semiconductor layer and on the surface of said semiconductor layers in said groove, respectively.

2. A process of producing a semiconductor light emitting device as defined in claim 1, wherein said semi-insulating or insulating substrate comprises InP.

3. A process of producing a semiconductor light emitting device as defined in claim 1, wherein said semi-insulating or insulating substrate comprises GaAs.

* * * * *